United States Patent [19]

Young

[11] 4,338,571
[45] Jul. 6, 1982

[54] LOW SENSITIVITY SWITCHED-CAPACITOR LADDER FILTER USING MONOLITHIC MOS CHIP

[75] Inventor: Ian A. Young, Farmers Branch, Tex.

[73] Assignee: Mostek Corporation, Carrollton, Tex.

[21] Appl. No.: 105,004

[22] Filed: Dec. 18, 1979

[51] Int. Cl.³ .............................................. H03F 1/34
[52] U.S. Cl. ........................................ 330/84; 330/107
[58] Field of Search .................. 330/51, 84, 107, 109; 307/233 R, 295; 328/167; 333/173

[56] References Cited

PUBLICATIONS

Bruton, "Low-Sensitivity Digital Ladder Filters", *IEEE Transactions on Circuits and Systems*, V. Cas-22, No. 3, Mar. 1975, pp. 168–176.
Allstot et al, "MOS Switched Capacitor Ladder Filters", *IEEE Journal of Solid-State Circuits*, vol. SC-13, No. 6, Dec. 1978, pp. 806–814.

Primary Examiner—James B. Mullins

[57] ABSTRACT

A switched-capacitor circuit (50) for passing an audio frequency over a predetermined range of frequencies fabricated on a monolithic semiconductor substrate is provided. The switched-capacitor filter (50) includes a first amplifier (60) and a second amplifier (90). A first integrator capacitor (66) is interconnected to the first amplifier (60). A second integrator capacitor (96) is interconnected to the first amplifier (90). A first input switched-capacitor (82) is interconnected between the first amplifier (60) and the second amplifier (90), such that the first input switched-capacitor (82) samples and holds the output of the second amplifier (90) during a first clock phase thereby isolating the output of the second amplifier (90) from the input of the first amplifier (60). During a second clock phase the first input switched-capacitor (82) applies the output of the second amplifier (90) to the first integrator capacitor (66). A second input switched-capacitor (112) is provided and is interconnected between the output of the first amplifier (60) and the input of the second amplifier (90), such that during the second clock phase the second input switched-capacitor (112) applies the output of the first amplifier (60) to the second integrator capacitor (96). The switched-capacitor circuit (50) functions such that effectively zero phase shift is introduced into the signal being processed by the switched-capacitor circuit (50).

15 Claims, 2 Drawing Figures

LOW SENSITIVITY SWITCHED-CAPACITOR LADDER FILTER USING MONOLITHIC MOS CHIP

TECHNICAL FIELD

This invention relates to audio frequency filters, and more particularly to a switched-capacitor ladder filter for fabrication in a monolithic MOS semiconductor substrate.

BACKGROUND ART

Electronic equipment such as telecommunications systems utilizing, for example, pulse-code modulation (PCM) and other voice-band systems require precision high-order filters. Conventional filtering approaches implementing audio and other low-frequency filters have utilized resistor-capacitor differential integrators. With the development of metal-oxide-semiconductor (MOS) technology such conventional filters have been fabricated monolithically as resistor-capacitor products. Such fabrication has required large amounts of semiconductor substrate area with the absolute values of both resistive and capacitive circuit elements being tightly controlled. This control is extremely difficult for typical temperature and processing variations.

Monolithic implementation of low-frequency filters requires filter operation similar to passive low-frequency filters having long time constants but is required to be fabricated in small semiconductor substrate areas and utilize transfer functions that are insensitive to parameter variations. Additionally, in such monolithic implementation it is desirable to obtain precise responses without external trimming operations. Previously developed conventional active filters implemented with thin-film or hybrid circuits have not provided a precision filter insensitive to temperature and processing variations.

As a result of the need for trimming techniques to ensure absolute values of components utilized in high-order filters and the need for maintaining temperature and processing variations independence, switched-capacitor integrator filters have been developed. Such switched-capacitor circuits closely approximate conventional differential integrators. The differential switched-capacitor integrator is operated with two-phase nonoverlapping clocks. A discussion of MOS switched-capacitor filters is found in a paper by Allstot et al, "MOS Switched Capacitor Ladder Filters"; *IEEE Journal of Solid-State Circuits,* Vol. SC-13, No. 6, December 1978.

In order to simulate capacitor and inductor elements used in passive filters, a switched-capacitor integrator must not introduce any phase shift in the signal being processed. Previously developed switched-capacitor filters simulating inductor-capacitor filters have introduced phase shifts such that these filter elements appeared as lossy inductors and lossy capacitors. With the introduction of a phase shift in the input signal, a degregation in the output response is produced such that existing switched-capacitor filters do not precisely simulate passive filter elements.

A need has thus arisen for a switched-capacitor filter for simulating capacitor and inductor elements in passive ladder filters in which the simulated capacitor and inductor elements have no loss due to an effective zero phase shift in the circuit simulating these elements in voltage and current domain. Such a switched-capacitor filter must be insensitive to parameter variations introduced by temperature and processing controls. Additionally, a need has arisen for a switched-capacitor filter in which circuit component values can be realized without a need for trimming. A need has further arisen for switched-capacitor filter circuit to implement doubly terminated ladder filters such as, high-pass, low-pass and bandpass filters being insensitive to component variations. Additionally, a need has further arisen for a switched-capacitor filter in which filter elements can be fabricated in small areas of a semiconductor substrate to permit for densely packed chips while simultaneously eliminating the effect of parasitic capacitances.

DISCLOSURE OF THE INVENTION

In accordance with the present invention, a switched-capacitor filter is provided for fabrication on a monolithic MOS semiconductor substrate which substantially eliminates the problems heretofore associated with switched-capacitor filters including the elimination of phase shift in the processed signal.

In accordance with the present invention, a switched-capacitor filter for passing audio frequencies over a predetermined range of frequencies fabricated on a monolithic semiconductor substrate is provided. The switched-capacitor filter includes a first amplifier and a first integrator capacitor interconnected to the first amplifier. A second amplifier and a second integrator capacitor interconnected to the second amplifier is provided. A first input switched-capacitor is interconnected between the input of the first amplifier and the output of the second amplifier, such that the first input switched-capacitor samples and holds the output of the second amplifier during a first clock phase thereby isolating the output of the second amplifier from the first integrator capacitor and during a second clock phase applies the sampled and held output of the second amplifier to the first integrator capacitor. A second input switched-capacitor is interconnected between the output of the first amplifier and the input of the second amplifier, such that during the first clock phase the second input switched-capacitor resets to zero stored charge and during the second clock phase the second input capacitor applies the output of the first amplifier to the second integrator capacitor.

In accordance with another aspect of the present invention, a switched-capacitor filter is provided which includes a first differential amplifier having an inverting input terminal a noninverting input terminal, and an output terminal. A first integrator capacitor is interconnected between the inverting input and output terminals of the first differential amplifier while the noninverting input is connected to ground potential. A second differential amplifier having an inverting input terminal, a noninverting input terminal and an output terminal is provided. A second integrator capacitor is interconnected between the inverting input terminal and output terminal of the second differential amplifier while the noninverting input is connected to ground potential. First and second input switched-capacitors are included within the switched-capacitor filter. A first switch circuit is interconnected to the first differential amplifier and the first input switched-capacitor. A second switch circuit is interconnected to the second differential amplifier and the second input switched-capacitor. A clock source is provided for generating first and second clock signals. The first input switched-capacitor is interconnected to the first switch circuit and between the inverting input of the first differential amplifier and the output of the second differential amplifier, such that the first input switched-capacitor samples and holds the output of the second differential amplifier when the switch circuits receive the first clock signal thereby isolating the output of the second differential amplifier from the first integrator capacitor of the first differential amplifier and such that when the switch circuits receive the second clock signal the sampled and held output of the second differential amplifier is applied to the first integrator capacitor. The second input switched-capacitor is interconnected to the second switch circuit and between the output terminal of the first differential amplifier and the inverting input terminal of the second differential amplifier, such that when the switch circuits receive the second clock signal the second input switched-capacitor applies the output of the first differential amplifier to the second integrator capacitor.

BRIEF DESCRIPTION OF DRAWINGS

For a more complete understanding of the present invention and for further objects and advantages thereof, reference will now be made to the following Detailed Description taken in conjunction with the accompanying Drawings in which.

DETAILED DESCRIPTION

Figure 1:
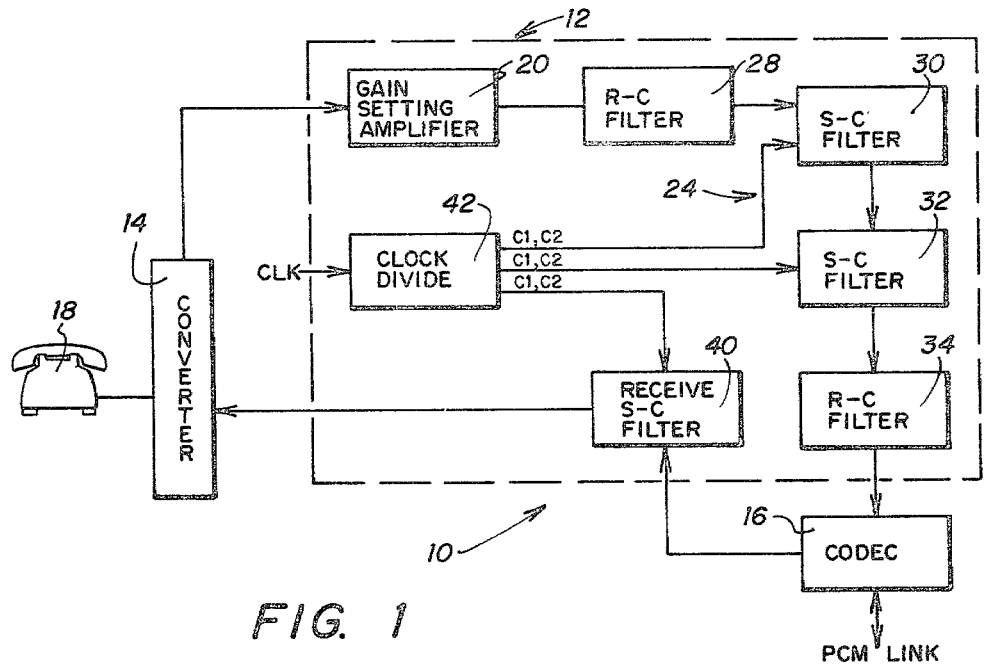
FIG. 1 is a block diagram of a pulse-code modulation telecommunications system utilizing the switched-capacitor filter of the present invention.

Referring to FIG. 1, a pulse-code modulation (PCM) telecommunications system generally identified by the numeral 10 is illustrated. System 10 includes a filter network generally identified by the numeral 12 interconnected between a converter 14 and an analog to digital and digital to analog converter (CODEC) 16. Converter 14 receives input signals from a telephone 18 and may comprise, for example, a two to four wire converter for applying an analog input to a gain setting amplifier 20. The output of gain setting amplifier 20 is passed through a bandpass filter generally identified by the numeral 24 whose output is applied to CODEC 16 for encoding for output on the PCM telecommunications link.

Bandpass filter 24 includes a continuous time resistor-capacitor filter 28 and may comprise, for example, a third order Sellen key-type filter having a cutoff frequency of 32 KHz. The output of filter 28 is applied to a switched-capacitor filter 30 which may comprise, for example, a third order high-pass filter having a cutoff frequency of 300 Hz. The output of switched-capacitor filter 30 is applied to a switched-capacitor filter 32 which may comprise, for example, a fifth order low-pass filter having a cutoff frequency of 3.2 KHz. Switched-capacitor filters 30 and 32 are the subject of the present invention and will be described in detail with reference to FIG. 2. The output of switched-capacitor filter 32 is applied to a continuous time resistor-capacitor filter 34 which may comprise, for example, a second order Sallen key-type filter having a cutoff frequency of 48 KHz.

Signals from the PCM telecommunications link are received by CODEC 16 for decoding and are applied to a switched-capacitor filter 40, the subject of the present invention which may comprise, for example, a fifth order low-pass filter having a cutoff frequency of 3.2 KHz to smooth the voltage steps present in the CODEC output wave form and to provide the necessary sin x/x correction necessary to provide unity gain in the passband for CODEC 16. The output of switched-capacitor filter 40 is applied to converter 14 for application to telephone 18.

A clock signal (CLK) is applied to a clock divide circuit 42 which generates a C1 and a C2 clock signal for application to switched-capacitor filters 30, 32 and 40. Filter network 12 is fabricated on a monolithic semiconductor substrate which includes all circuit components shown within the dashed line of FIG. 1 including gain setting amplifier 20, resistor-capacitor filters 28 and 34, switched-capacitor filters 30, 32 and 40 and clock divide circuit 42.

Figure 2:
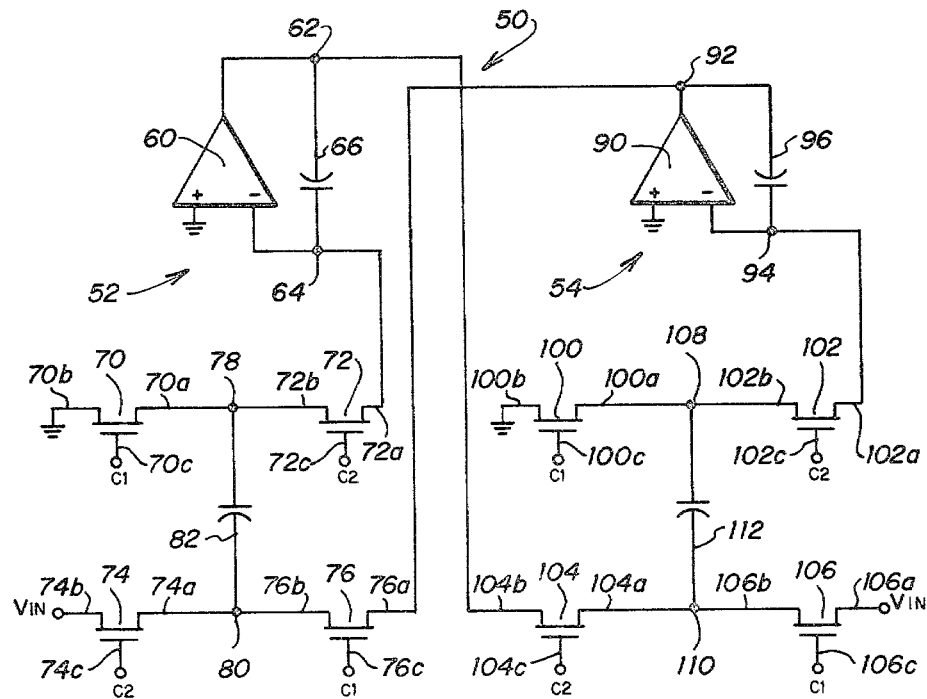
FIG. 2 is a schematic circuit diagram of the present switched-capacitor filter.

Referring to FIG. 2, the switched-capacitor circuit of the present invention is illustrated and is generally identified by the numeral 50. Switched-capacitor circuit 50 includes an integrating block generally identified by the numeral 52 and an integrating block generally identified by the numeral 54. Integrating blocks 52 and 54 form a two integrator loop which can be interconnected in a multiple feedback or leapfrog configuration for implementation and simulation of ladder filters. An important aspect of the present invention is that switched-capacitor circuit 50 introduces no phase shift to a signal processed around the two integrator loop composed of integrating blocks 52 and 54 during the filtering process. Integrating block 52 may comprise, for example, a backward Euler integrator which introduces a phase lag in the input signal undergoing filtering. Integrating block 54 may comprise, for example, a forward Euler integrator which introduces a phase lead in the signal undergoing filtering. The overall effect of the loop interconnection of integrating blocks 52 and 54 is to balance out the phase lag and phase lead introduced into the signal undergoing processing such that switched-capacitor circuit 50 operates as a lossless circuit simulating inductor-capacitor passive elements in LC filters.

Switched-capacitor circuit 50 may be replicated and interconnected with other switched-capacitor circuits 50 in a leapfrog or multiloop feedback configuration implementing ladder filters to form any number of poles in a higher order filter. For example, switched-capacitor filter 30 (FIG. 1) would include switched-capacitor circuit 50 replicated one and one-half times interconnected in a multiloop feedback configuration. Similarly, switched-capacitor filters 32 and 40 (FIG. 1) are formed by replicating switched-capacitor circuit 50 five times in a leapfrog configuration, wherein amplifiers are shared between adjacent loops.

Integrating block 52 includes a differential amplifier 60 having an output terminal 62 and an inverting input terminal 64. Interconnected between output terminal 62 and inverting input terminal 64 of differential amplifier 60 is an integrator capacitor 66. The noninverting input of differential amplifier 60 is connected to ground potential.

Integrating block 52 further includes a switch 70 having terminals 70a and 70b and a control terminal 70c; a switch 72 having terminals 72a and 72b and a control terminal 72c; a switch 74 having terminals 74a and 74b and a control terminal 74c; and a switch 76 having terminals 76a and 76b and a control terminal 76c. Terminal 70b of switch 70 is interconnected to ground potential. Terminal 70a of switch 70 is interconnected to terminal 72b of switch 72 to form a node 78. Terminal 74b of switch 74 is interconnected to an input voltage source which may comprise either ground potential or a value above ground potential depending upon the termination network associated with integrating block 52 and whether switched-capacitor filter 50 is configured as a high-pass or low-pass filter to be subsequently described. Terminal 74a of switch 74 is interconnected to terminal 76b of switch 76 to form a node 80. Interconnected between nodes 78 and 80 is an input switched-capacitor 82. Terminal 72a of switch 72 is interconnected to inverting input terminal 64 of differential amplifier 60.

Integrating block 54 includes a differential amplifier 90 having an output terminal 92 and an inverting input 94. An integrator capacitor 96 is interconnected between output terminal 92 and the inverting input terminal 94 of differential amplifier 90. The noninverting input of differential amplifier 90 is interconnected to ground potential.

Integrating block 54 further includes a switch 100 having terminals 100a and 100b and a control terminal 100c; a switch 102 having terminals 102a and 102b and a control terminal 102c; a switch 104 having terminals 104a and 104b and a control terminal 104c; and a switch 106 having terminals 106a and 106b and a control terminal 106c. Terminal 100b of switch 100 is interconnected to ground potential. Terminal 100a of switch 100 is interconnected to terminal 102b of switch 102 to form a node 108. Terminal 104a of switch 104 is interconnected to terminal 106b of switch 106 to form a node 110. An input switched-capacitor 112 is interconnected between nodes 108 and 110. Terminal 106a of switch 106 is interconnected to a voltage source which may be at ground potential or a value other than ground potential depending upon the termination of integrating block 54 and whether switched-capacitor filter 50 is configured as a high-pass or low-pass filter. Terminal 102a of switch 102 is interconnected to the inverting input terminal 94 of differential amplifier 90.

Integrating blocks 52 and 54 are interconnected such that output terminal 62 of differential amplifier 60 is connected to terminal 104b of switch 104 and output terminal 92 of differential amplifier 90 is interconnected to terminal 76a of switch 76. Additional switched-capacitor circuits 50 are interconnected in a similar multiloop feedback or leapfrog fashion. Applied to the control terminals of switches 70, 76, 100 and 106 is the C1 clock signal which when active renders switches 70, 76, 100 and 106 conductive. A clock signal C2 is applied to the control terminals of switches 72, 74, 102 and 104, such that when clock signal C2 is active, switches 72, 74, 102 and 104 are conductive.

In operation of the present switched-capacitor circuit 50 for purposes of this discussion it is assumed that terminal 74b of switch 74 and terminal 106a of switch 106 are at ground potential. The output of differential amplifier 90 during a first clock phase such that the C1 clock signal is active is applied to input switched-capacitor 82 at node 80 of integrating block 52. Since switch 70 is also conductive during the first clock phase, terminal 70b of switch 70 is at ground potential to thereby charge input switched-capacitor 82 to the value of the output voltage of differential amplifier 90. Switches 72 and 74 are off during the first clock phase. Therefore, it can be seen that input switched-capacitor 82 samples and holds the output voltage of differential amplifier 90 during the first clock phase.

During a second clock phase the C2 signal is generated and is applied to control terminals 72c and 74c of switches 72 and 74 thereby rendering switches 72 and 74 conductive. Since node 78 is held at ground potential by differential amplifier 60 and because terminal 74b is at ground potential, the previously sampled and stored charge on input switched-capacitor 82 is integrated into integrator capacitor 66. A phase lag has been introduced into the output voltage signal of differential amplifier 90 at the output of differential amplifier 60.

During the first clock phase switches 100 and 106 of integrating block 54 are conductive, such that ground potential is applied to node 108 of input switched-capacitor 112 and ground potential is applied to node 110 of input switched-capacitor 112 such that zero charge is maintained by input switched-capacitor 112.

During the second clock phase wherein clock signal C2 is generated, switches 104 and 102 are rendered conductive. The voltage output by differential amplifier 60 from output terminal 62 is therefore applied to input switched-capacitor 112 to immediately charge input switched-capacitor 112 to the output voltage of differential amplifier 60. Since switch 102 is also conductive during the second clock phase and node 94 is held at ground potential by amplifier 90, the charge which is inputted to switched-capacitor 112 is immediately applied to inverting input terminal 94 of differential amplifier 90 such that integrator capacitor 96 integrates the voltage appearing across input switched-capacitor 112. On the next cycle of the first clock phase the voltage output by differential amplifier 90 appearing at output terminal 92 is applied to terminal 76a of switch 76. It therefore can be seen that integrating block 54 immediately integrates voltage appearing across input switched-capacitor 112 whereas integrating block 52 samples and holds the output voltage of differential amplifier 90 for one clock phase by charging input switched-capacitor 82 before integrator capacitor 66 receives this charge. The output voltage of differential amplifier 60 is coupled directly and integrated directly into integrator capacitor 96 during clock phase two.

In summary, the output voltage of differential amplifier 60 is directly coupled through input switched-capacitor 112 to integrator capacitor 96 to the output of differential amplifier 90. The output of differential amplifier 90 is sampled and held by input switched-capacitor 82 during the first clock phase and then during the second clock phase is passed into integrator capacitor 66. The sample and holding effect of input switched-capacitor 82 causes any voltage change of the output of differential amplifier 90 to not appear at the output of differential amplifier 60 until the second clock phase whereas any change in the output voltage of differential amplifier 60 occurs directly at the output of differential amplifier 90. Due to the operation of input switched-capacitor 82, differential amplifier 60 is isolated during clock phase one from differential amplifier 90. Integrating block 52 performs positive integration of the output signal of differential amplifier 90 whereas integrating block 54 provides negative integration of the output signal generated by differential amplifier 60 such that no phase shift occurs in a signal processed around this loop.

As previously stated, terminal 74b of switch 74 may alternatively be interconnected to a voltage source other than ground potential. If switched-capacitor circuit 50 is the first integrator loop within switched-capacitor filter 32 (FIG. 1) terminal 74b of switch 74 is interconnected to the output signal generated by switched-capacitor filter 30. If switched-capacitor 50 is the first integrator loop within switched-capacitor filter 40 (FIG. 1) terminal 74b of switch 74 is interconnected to the output signal generated by CODEC 16.

The input to switched-capacitor filter 32 and switched-capacitor filter 40 (FIG. 1) can also be applied utilizing a coupling switched-capacitor together with two additional switches interconnected in a configuration similar to switched-capacitor 82 and switches 74 and 76 (FIG. 2). The top plate of the coupling switched-capacitor is interconnected to node 78 or node 108 while the bottom plate of the coupling switched-capacitor is interconnected to the node corresponding to node 80 between the two additional switches. One of the additional switches is connected between the input voltage source or output signal of switched-capacitor filter 30 or the output of CODEC 16 (FIG. 1) and the common node while the second additional switch is connected between ground voltage potential and the common node. The resulting configuration forms a low-pass filter.

If switched-capacitor circuit 50 is implemented within switched-capacitor filter 30 (FIG. 1) a coupling capacitor is connected from the output signal of resistor-capacitor filter 28 to node 64 or 94 (FIG. 2), such that the resulting configuration of switched-capacitor circuit 50 operates as a high-pass filter.

The transfer function of integrating block 52 is as follows:

$$\frac{V_{out}}{V_{in}} = +\frac{C_1}{C_2} \frac{1}{z-1} \quad (1)$$

where
$V_1$ is the output voltage of differential amplifier 60;
$V_2$ is the output voltage of differential amplifier 90;
$C_1$ is the value of capacitor 82;
$C_2$ is the value of capacitor 66; and
z is the sampled data frequency variable which related to the continuous frequency variable s via the bilinear transformation; $s=(z-1)/(z+1)$.

The transfer function of integrating block 54 is as follows:

$$\frac{V_{out}}{V_{in}} = -\frac{C_1}{C_2} \frac{z}{z-1} \quad (2)$$

where
$V_1$ is the output voltage of differential amplifier 60;
$V_2$ is the output voltage of differential amplifier 90;
$C_3$ is the value of capacitor 112;
$C_4$ is the value of capacitor 96; and
z is the sampled date frequency variable.

An important aspect of the present invention in addition to switched-capacitor circuit 50 introducing no phase shift for signals processed by switch-capacitor circuit 50 is that the effect of parasitic capacitances on switched-capacitor filters 50 are substantially eliminated. Previously developed switched-capacitor filters required that the input switched-capacitors be made very large such that the parasitic capacitance did not have a very significant effect on the operation of these filters. By making the input switched-capacitors large, a corresponding increase in the semiconductor substrate area for the input switched-capacitor was required thereby decreasing the packing density of elements on the semiconductor substrate and increasing the overall size and cost of the semiconductor substrate. Due to the configuration of the present switched-capacitor filter, input switched-capacitors 82 and 112 are insensitive to parasitics so that input switched-capacitors 82 and 112 can be fabricated in a very small area on the semiconductor substrate.

Referring again to FIG. 2, since node 78 of input switched-capacitor 82 is switched between ground potential held by differential amplifier 60 and ground potential at terminal 70b of switch 70, any parasitic capacitance at node 78 is always charged to the same voltage appearing at node 78. Therefore, no charge is lost on input switched-capacitor 82 due to a parasitic capacitance appearing at node 78. Since node 80 switches between a voltage applied from differential amplifier 90 and a voltage source appearing at terminal 74b of switch 74, should any parasitic capacitance appear at node 80 the parasitic capacitance will be charged by the output voltage of differential amplifier 90 and discharged by the voltage source appearing at terminal 74b of switch 74. Therefore, any parasitic voltage appearing at node 80 never enters into the integration aspect of the present switched-capacitor circuit 50. Similarly, any parasitic capacitance present at nodes 108 and 110 of integrating block 54 do not affect switched-capacitor 112.

Higher ordered switched-capacitor filters can be formed using the present switched-capacitor circuit 50 by configuring a multiloop feedback or leapfrog connection of switched-capacitor circuits 50 based on a ladder network. The odd integrating blocks of the higher order ladder network perform positive integration while the even integrating blocks of the ladder network perform negative integration. Integrating blocks 52 and 54 can be configured to function as a high-pass or low-pass filter. For example, integrating block 52 can simulate a current through a series inductor while integrating block 54 simulates the voltage through a shunt capacitor in a low-pass filter. In a high-pass filter configuration, integrating block 52 can simulate the voltage appearing across a series capacitor while integrating block 54 simulates the current through a shunt inductor.

The termination networks for switched-capacitor circuit 50 are similarly configured to integrating blocks 52 and 54 such that if a backward integrator is used to terminate integrating block 52, a forward integrator will be utilized to terminate integrating block 54. In the configuration where a resistive termination is utilized in the first integrator loop within an inductor-capacitor ladder, node 74b (FIG. 2) can be interconnected to the output terminal 62 of differential amplifier 60 to form a backward Euler integrator and terminal 106a of the last integrator loop within the inductor-capacitor ladder can be connected to output terminal 92 of differential amplifier 90 forming a forward Euler integrator. The resulting terminations are lossy integrators and simulate the resistive impedances at the input or output of an inductor-capacitor ladder.

To effectuate coupling between integrator loops of switched-capacitor circuits 50 in multiloop feedback or leapfrog filter configurations as previously stated, in a low-pass filter configuration an additional input switched-capacitor is connected to node 78 and/or node 108 (FIG. 2). This additional input switched-capacitor is interconnected utilizing two additional switches configured similarly to switches 74 and 76 or switches 104 and 106 and are operated to receive an input signal in conjunction with their adjoining switched-capacitor integrators in the manner previously described for the operation of switched-capacitor circuit 50.

For the implementation of high-pass filter coupling between switched-capacitor circuits 50, a capacitor is connected directly to the inverting input terminal 64 or 94 (FIG. 2) of either or both amplifiers 60 and 90 within switched-capacitor circuit 50 and receive the input signal. These input capacitors are summing capacitors and have a value equal to that of the integrator capacitor 66 or 96 of the particular integrating block 52 or 54 and interconnect the output of an amplifier 60 or 90 within a switched-capacitor circuit 50 to the inverting input terminal of an amplifier corresponding to amplifier 60 or 90 in a subsequent switched-capacitor circuit 50.

To summarize, low-pass filter coupling is accomplished using integration of the input signal applied to switched-capacitor circuits 50. High-pass filter coupling is performed utilizing a summation of the input signal generated by interconnecting switched-capacitor circuits 50.

It therefore can be seen that the present switched-capacitor circuit using MOS switched-capacitor integrators provides for a filter in which the lossless inductor-capacitor element values of a high-pass or low-pass filter ladder can be precisely implemented. The use of switched-capacitor filters creates a precision filter wherein no trimming of precision components is necessary. The use of switched-capacitor integrators having gain constants determined by capacitor ratios permit ease in fabrication in MOS technology and permit temperature stability. Furthermore, the switched-capacitor circuit of the present invention operates free of parasitic capacitances which enhances the capability of the present invention to realize precision filters that do not require trimming of component values. The switched-capacitor circuit of the present invention can be fabricated in a small area of a semiconductor substrate to provide for a very dense packing of circuit elements to minimize the overall area of the semiconductor substrate thereby minimizing costs in the fabrication of the present switched-capacitor filter.

Whereas the present invention has been described with respect to specific embodiments thereof, it will be understood that various changes and modifications will be suggested to one skilled in the art and it is intended to encompass such changes and modifications as fall within the scope of the appended claims.

I claim:

1. A switched-capacitor filter for passing an input audio frequency over a predetermined range of frequencies fabricated on a monolithic semiconductor substrate comprising:
   a first amplifier having input and output terminals;
   a first integrator capacitor interconnected to said first amplifier;
   a second amplifier having input and output terminals;
   a second integrator capacitor interconnected to said second amplifier;
   a first input switched-capacitor interconnected between said input terminal of said first amplifier and said output terminal of said second amplifier, such that said first input switched-capacitor samples and holds the output of said second amplifier during a first clock phase thereby isolating said output terminal of said second amplifier from said first integrating capacitor and during a second clock phase applies the sampled and held output of said second amplifier to said first integrator capacitor; and
   a second input switched-capacitor interconnected between said output terminal of said first amplifier and said input terminal of said second amplifier, such that during said second clock phase said second input switched-capacitor applies the output of said first amplifier to said second integrator capacitor.

2. The switched-capacitor filter of claim 1 and further including switch means interconnected to said first amplifier and said first input switched-capacitor.

3. The switched-capacitor filter of claim 2 wherein said switch means includes first, second, third and fourth switch means each having first and second terminals and a control terminal such that:
   said first terminal of said first switch means is interconnected to a ground voltage potential, said second terminal of said first switch means is interconnected to said first terminal of said second switch means to form a first node, said second terminal of said second switch means is interconnected to said input terminal of said first amplifier;
   said control terminal of said first switch means is interconnected to receive a first clock signal during said first clock phase;
   said control terminal of said second switch means is interconnected to receive a second clock signal during said second clock phase;
   said first terminal of said third switch means is interconnected to a voltage potential, said second terminal of said third switch means is interconnected to said first terminal of said fourth switch means to form a second node and said second terminal of said fourth switch means is interconnected to said output terminal of said second amplifier;
   said control terminal of said third switch means is interconnected to receive said second clock signal; and
   said control terminal of said fourth switch means is interconnected to receive said first clock signal.

4. The switched-capacitor filter of claim 3 wherein said first input switched-capacitor is interconnected between said first and second nodes.

5. The switched-capacitor filter of claim 3 wherein said voltage potential is ground potential.

6. The switched-capacitor filter of claim 1 and further including switch means interconnected to said second amplifier and said second input switched-capacitor.

7. The switched-capacitor filter of claim 6 wherein said switch means includes first, second, third and fourth switch means each having first and second terminals and a control terminal such that:
   said first terminal of said first switch means is interconnected to a ground voltage potential, said second terminal of said first switch means is interconnected to said first terminal of said second switch means to form a first node, said second terminal of said second switch means is interconnected to said input terminal of said second amplifier;
   said control terminal of said first switch means is interconnected to receive a first clock signal during said first clock phase;
   said control terminal of said second switch means is interconnected to receive a second control signal during said second clock phase;
   said first terminal of said third switch means is interconnected to said output terminal of said first amplifier, said second terminal of said third switch means is interconnected to said first terminal of said fourth switch means to form a second node and said second terminal of said fourth switch means is interconnected to a voltage potential;

said control terminal of said third switch means is interconnected to receive said second clock signal; and said control terminal of said fourth switch means is interconnected to receive said first clock signal.

8. The switched-capacitor filter of claim 7 wherein said voltage potential is ground potential.

9. The switched-capacitor filter of claim 1 wherein said capacitors comprise MOS switched-capacitors.

10. The switched-capacitor filter of claim 1 wherein said first amplifier, first integrator capacitor and first input switched-capacitor introduce a phase lag in the input audio frequency signal and said second amplifier, second integrator capacitor and second input switched-capacitor introduce a phase lead in the audio frequency signal, such that the resulting processed signal has no phase shift.

11. The switched-capacitor filter of claim 1 and further including:
a coupling capacitor interconnected to said input terminal of at least one of said amplifiers to receive an input signal to be processed wherein the switched-capacitor filter operates as a high-pass filter.

12. In a pulse-code modulation telecommunications system including an audio signal generating device and a coding/decoding device wherein a high-pass and low-pass filter are disposed between the generating device and the coding/decoding device, a switched-capacitor filter comprising:
a first amplifier having input and output terminals;
a first integrator capacitor interconnected to said first amplifier;
a second amplifier having input and output terminals;
a second integrator capacitor interconnected to said second amplifier;
a first input switched-capacitor interconnected between said input terminal of said first amplifier and said output terminal of said second amplifier, such that said first input switched-capacitor samples and holds the output of said second amplifier during a first clock phase thereby isolating said output terminal of said second amplifier from said input terminal of said first amplifier and during a second clock phase applies the sampled and held output of said second amplifier to said first integrator capacitor; and
a second input switched-capacitor interconnected between said output terminal of said first amplifier and said input terminal of said second amplifier, such that during said second clock phase said second input switched-capacitor applies the output of said first amplifier to said second integrator capacitor.

13. A switched-capacitor filter for passing an input audio frequency over a predetermined range of frequencies fabricated on a monolithic semiconductor substrate comprising:
first differential amplifier means having an inverting input terminal and an output terminal;
a first integrator capacitor interconnected between said inverting input terminal and output terminal of said first differential amplifier means;
second differential amplifier means having an inverting input terminal and an output terminal;
a second integrator capacitor interconnected between said inverting input terminal and output terminal of said second differential amplifier means;
a first input switched-capacitor;
first switch means interconnected to said first differential amplifier means and said first input switched-capacitor;
a second input switched-capacitor;
second switch means interconnected to said second differential amplifier means and said second input switched-capacitor;
clock means interconnected to said switch means for generating first and second clock signals;
said first input switched-capacitor interconnected to said first switch means and between said inverting input terminal of said first differential amplifier means and said output of said second differential amplifier means, such that said first input switched-capacitor samples and holds the output of said second differential amplifier means when said switch means receives said first clock signal thereby isolating said output of said second differential amplifier means from said inverting input terminal of said first differential amplifier means and such that when said switch means receives said second clock signal the output of said second differential amplifier means is applied to said first integrator capacitor to introduce a phase lag in the input audio frequency; and
said second input switched-capacitor interconnected to said second switch means and between said output terminal of said first differential amplifier means and said inverting input terminals of said second differential amplifier means, such that when said switch means receives said second clock signal said second input switched-capacitor applies the output of said first differential amplifier means to said second integrator capacitor to introduce a phase lead in the input audio frequency.

14. A switched-capacitor filter for passing an input audio frequency over a predetermined range of frequencies fabricated on a monolithic semiconductor substrate comprising:
first differential amplifier means having an inverting input terminal and an output terminal;
a first integrator capacitor interconnected between said inverting input terminal and output terminal of said first differential amplifier means;
second differential amplifier means having an inverting input terminal and an output terminal;
a second integrator capacitor interconnected between said inverting input terminal and output terminal of said second differential amplifier means;
a first input switched-capacitor;
clock means for generating first and second clock signals during first and second clock phases;
first switch means interconnected to said first differential amplifier means and said first input switched-capacitor;
said first switch means including first, second, third and fourth switch means each having first and second terminals and a control terminal such that:
said first terminal of said first switch means is interconnected to a ground voltage potential, said second terminal of said first switch means is interconnected to said first terminal of said second switch means to form a first node, said second terminal of said second switch means is interconnected to said inverting input terminal of said first differential amplifier means;

said control terminal of said first switch means is interconnected to receive said first clock signal during said first clock phase;

said control terminal of said second switch means is interconnected to receive said second clock signal during said second clock phase;

said first terminal of said third switch means is interconnected to a voltage potential, said second terminal of said third switch means is interconnected to said first terminal of said fourth switch means to form a second node and said second terminal of said fourth switch means is interconnected to said output terminal of said second differential amplifier means;

said control terminal of said third switch means is interconnected to receive said second clock signal during said second clock phase; and said control terminal of said fourth switch means is interconnected to receive said first clock signal during said first clock phase; a second input switched-capacitor;

second switch means interconnected to said second differential amplifier means and said second input switched-capacitor;

said second switch means including fifth, sixth, seventh and eighth switch means each having first and second terminals and a control terminal such that:

said first terminal of said fifth switch means is interconnected to a ground voltage potential, said second terminal of said fifth switch means is interconnected to said first terminal of said sixth switch means to form a third node, said second terminal of said sixth switch means is interconnected to said input terminal of said second differential amplifier means;

said control terminal of said fifth switch means is interconnected to receive said first clock signal during said first clock phase;

said control terminal of said sixth switch means is interconnected to receive said second clock signal during said second clock phase;

said first terminal of said seventh switch means is interconnected to said output terminal of said first differential amplifier means, said second terminal of said seventh switch means is interconnected to said first terminal of said eighth switch means to form a fourth node and said second terminal of said eighth switch means is interconnected to a voltage potential;

said control terminal of said seventh switch means is interconnected to receive said second clock signal during said second clock phase; and said control terminal of said eighth switch means is interconnected to receive said first clock signal during said first clock phase;

said first input switched-capacitor interconnected between said first and second nodes, such that said first input switched-capacitor samples and holds the output of said second differential amplifier means when said switch means receives said first clock signal thereby isolating said output of said second differential amplifier means from said inverting input terminal of said first differential amplifier means and such that when said switch means receives said second clock signal the sampled and held output of said second differential amplifier means is applied to said first integrator capacitor to introduce a phase lag in the input audio frequency; and said second input switched-capacitor interconnected between said third and fourth nodes, such that when said switch means receives said second clock signal said second input switched-capacitor applies the output of said first differential amplifier means to said second integrator capacitor to introduce a phase lead in the input audio frequency.

15. A switched-capacitor filter comprising:

a first amplifier having input and output terminals;

a first integrator capacitor interconnected to said first amplifier;

a second amplifier having input and output terminals;

a second integrator capacitor interconnected to said second amplifier;

a first input switched-capacitor interconnected between said input terminal of said first amplifier and said output terminal of said second amplifier, such that said first input switched-capacitor samples and holds the output of said second amplifier during a first clock phase thereby isolating said output terminal of said second amplifier from said first integrator capacitor and during a second clock phase applies the sampled and held output of said second amplifier to said first integrator capacitor; and a second input switched-capacitor interconnected between said output terminal of said first amplifier and said input terminal of said second amplifier, such that during said second clock phase said second input switched-capacitor applies the output of said first amplifier to said second integrator capacitor.

* * * * *